United States Patent [19]

Blieden

[11] 4,130,445
[45] Dec. 19, 1978

[54] LIGHT COLLECTOR

[75] Inventor: Harry R. Blieden, Los Angeles, Calif.

[73] Assignee: Atlantic Richfield Company, Los Angeles, Calif.

[21] Appl. No.: 888,095

[22] Filed: Mar. 20, 1978

[51] Int. Cl.² .............................................. H01L 31/04
[52] U.S. Cl. ........................ 136/89 PC; 136/89 HY; 250/227
[58] Field of Search ..................... 136/89 PC, 89 HY; 250/238

[56] References Cited

U.S. PATENT DOCUMENTS

| 3,484,606 | 12/1969 | Masi | 250/71 |
| 3,912,931 | 10/1975 | Gravisse | 250/458 |
| 4,002,031 | 1/1977 | Bell | 60/641 |
| 4,056,405 | 11/1977 | Varadi | 136/89 PC |

FOREIGN PATENT DOCUMENTS 2501907 7/1976 Fed. Rep. of Germany ...... 136/89 PC

Primary Examiner—John H. Mack
Assistant Examiner—Aaron Weisstuch
Attorney, Agent, or Firm—Roderick W. MacDonald

[57] ABSTRACT

A luminescent photovoltaic array which employs a luminescent member carrying photovoltaic means on at least one of its sides, and conduit means in heat exchange contact with at least one side of said luminescent member, said conduit means being adapted to have a cooling fluid pass therethrough for cooling said luminescent member.

9 Claims, 11 Drawing Figures

LIGHT COLLECTOR

BACKGROUND OF THE INVENTION

It is known that photovoltaic cells absorb photon energy from sunlight and use specially prepared semiconductor junctions to convert part of the energy thus received to electricity.

It is also known that a specific photovoltaic semiconductor junction can utilize, for conversion to electricity, only a portion of the spectrum of photon energy available. For example, the conversion of sunlight to electrical energy using well known silicon photovoltaic cells is strongly dependent upon the conversion of light with energy around 1.1 electron volts, while some of the lower energy light also present is not converted to electricity but rather to heat. The heat generated can reduce the efficiency of the silicon cell.

Accordingly, current photovoltaic cells receive more energy input from incident light than they convert into electrical output, and it is highly desirable to increase the amount of light energy an array retains for such conversion.

One known approach for increasing the capacity of photovoltaic cells to convert a wider spectrum of photon energies to electricity is to employ one or more luminescent agents which, when exposed to sunlight, absorb the higher energy light and in response emit lower energy light. Examples of such agents are organic dyes such as the dyes heretofore employed in the scintillation counters, lasers, and the like.

The particular luminescent agent or agents employed in conjunction with a specific photovoltaic cell are chosen, inter alia, for their ability to produce light of an energy level which best suits the conversion characteristics of that cell. This way, a portion of the higher energy light that would otherwise not be utilized by the cell for electrical generation is transformed by the luminescent agent into lower energy light that the cell can readily convert into electricity, thereby increasing the efficiency of the cell.

A photovoltaic array which employs this approach is referred to as a luminescent photovoltaic array. Such an array usually employs fluorescent dyes, fluorescence being that species of luminescence wherein the emitted light is usually in the visible spectrum. However, other species of luminescence exist, for example, phosphorescence where light emission continues after the stimulating light has stopped.

It should be understood that this invention applies to all species of luminescence, as well as to all types of luminescent agents.

SUMMARY OF THE INVENTION

According to this invention there is provided a luminescent photovoltaic device or array which carries in heat exchange association therewith at least one conduit means adapted to have a cooling fluid passed therethrough to cool the luminescent member.

Even though a larger amount of energy from light is converted into electricity by combining a luminescent member with a photovoltaic means, there is still a substantial amount of light energy which is not converted to electricity and manifests itself essentially as heat in the luminescent member. Unduly elevated temperatures can have a deleterious effect on the photovoltaic cells by reducing the efficiency of the photovoltaic means for the conversion of light energy to electricity. Since the photovoltaic cells are normally in close physical association with the luminescent member that is heated under normal operating conditions, it is highly desirable from the standpoint of long life as well as efficiency of operation of the cells to cool the luminescent member.

Accordingly, it is an object of this invention to provide a new and improved luminescent photovoltaic device. It is another object to provide a luminescent photovoltaic device with increased efficiency and life of operation.

Other aspects, objects and advantages of this invention will be apparent to those skilled in the art from this disclosure and the appended claims.

DETAILED DESCRIPTION OF THE INVENTION

Figure 1:
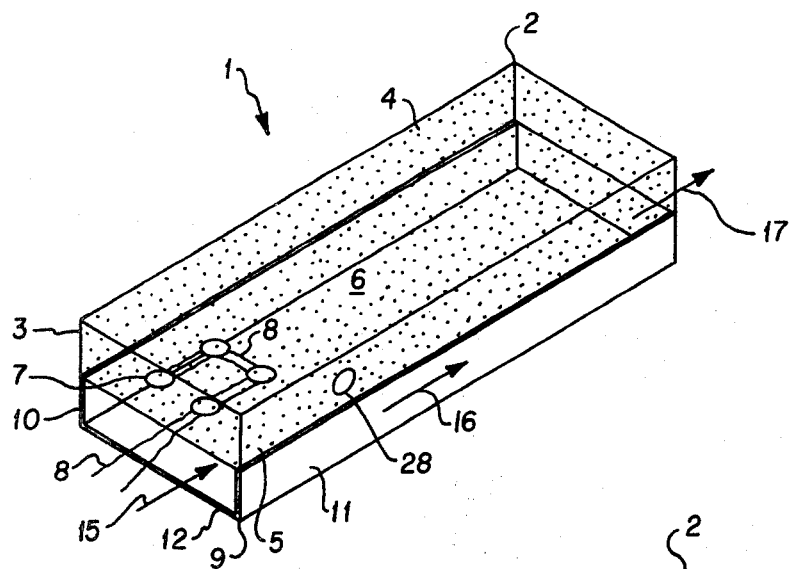
FIG. 1 shows one embodiment of a planar device within this invention.

More specifically, FIG. 1 shows a luminescent photovoltaic device 1 having an upper planar luminescent member 2 with a plurality of sides 3 through 6. A plurality of photovoltaic cells 7 is carried on the bottom side 6 of member 2, the cells being wired to one another by way of wires 8 so that electricity can be withdrawn from the device. Bottom side 6 has, integrally fixed thereto, conduit means 9 which is composed of upstanding sides 10 and 11 and bottom side 12, the upper side being formed by luminescent member 2.

It should be understood that conduit means 9 can, if desired, have a separate side closing the top, which separate side is in intimate contact, such as by gluing and the like, with bottom side 6 of member 2, the primary requirement being that conduit means 9 be in good heat exchange contact with side 6 of member 2. This way, when a cooling fluid such as air, water, glycol, and the like, including mixtures of gas and liquid, is passed into conduit 9 as shown by arrow 15 the fluid will come in contact with large surface area 6 either directly or indirectly through the upper side 18 (FIG. 2) of the conduit means as shown by arrow 16, thereby picking up heat from member 2 and removing that heat from the member as shown by arrow 17. If, as shown in FIG. 1, the photovoltaic cells 7 are also exposed to the cooling medium of the conduit means they will be directly cooled by that medium, thereby maintaining them essentially at or more closely to the temperature of the cooling fluid itself.

Figure 2:
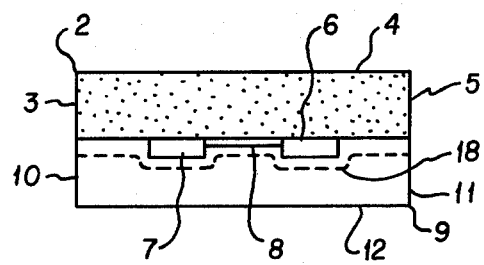
FIG. 2 shows a cross-section of the device of FIG. 1.

This is better illustrated in FIG. 2, which shows a cross-section of device 1 wherein photovoltaic cells 7 extend down into conduit 9, thereby exposing them to direct cooling. If an upper side is employed for conduit 9 to physically isolate the cells from the cooling medium or for any other reason, the upper surface can be made to conform to and intimately contact the cells for good indirect cooling of the cells as shown by dotted line 18 in FIG. 2.

The conduit means can be formed from many materials so long as it will channel the desired gaseous and/or liquid cooling medium and is compatible with the material from which member 2 and cells 7 are made. The conduit means could be formed from the same material as luminescent member 2 or a different material, e.g., polymeric, glass, metal, or anything else desired and obvious to one skilled in the art. Of course, thermal insulation could be applied to the conduit means.

It should be understood that the conduit means of this invention can even be formed from the luminescent member itself as will be disclosed in greater detail hereinafter.

Figure 3:
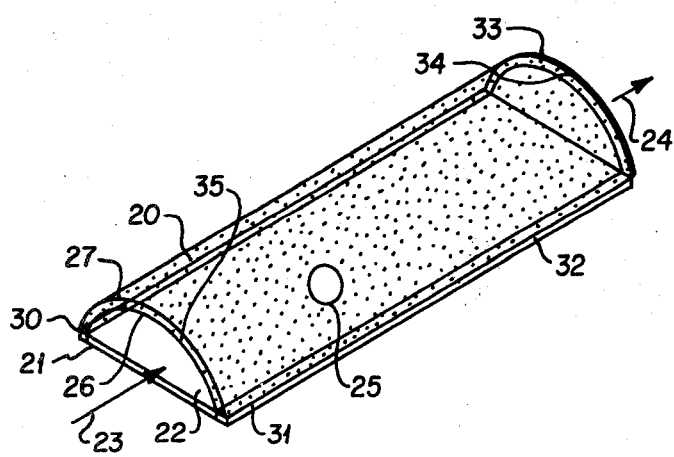
FIG. 3 shows a curvilinear embodiment within the scope of this invention.

FIG. 3 shows a curvilinear luminescent member 20 which in this particular embodiment is semicylindrical in shape, has its open end pointed downwardly, and is closed by a solid member 21. This defines conduit means 22 to be formed in part by luminescent member 20 and in part by an additional member 21. Cooling medium can flow into conduit 22, as shown by arrow 23, to pick up heat from member 20 and carry that heat away as shown by arrow 24.

Photovoltaic cell 25 can be employed on inner surface 26 of member 20 so that the cell can extend into the cooling conduit 22 in the same manner disclosed for cell 7 in FIG. 2. However, if desired, a photovoltaic cell could be employed on outer surface 27 of member 20 in addition to or in lieu of cell 25. The same could be done for the device of FIG. 1, i.e., a photovoltaic cell being employed on a side other than side 6, for example, photovoltaic cell 28 on side 5 of member 2 of FIG. 1.

In addition to, or in lieu of, photovoltaic cells on sides 21 and 27 of member 20, photovoltaic cells can be employed along one or more edges of member 20. A strip type photovoltaic cell could be employed on either or both of the longitudinal edges 30 and 31 of member 20. For example, a strip photovoltaic cell 32 is shown to run along the entire edge 31. Also a strip photovoltaic cell 33 could be employed along the end edge 34 of member 20. A similar adaptation could also be employed, if desired, for the forward edge 35 of member 20.

Figure 4:
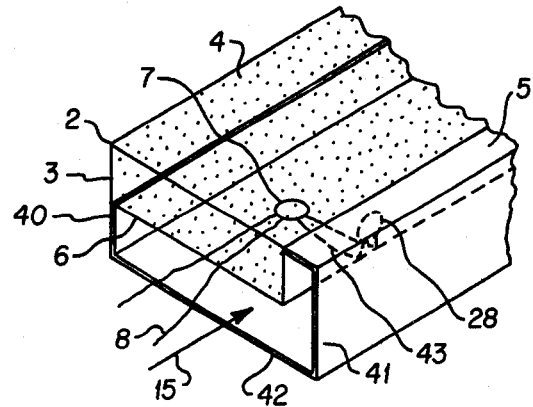
FIGS. 4 through 6 show conduit means variations relating to the device of FIG. 1.

FIG. 4 shows an embodiment of an adaptation of FIG. 1 wherein the cooling conduit covers more than one side of the luminescent member. In FIG. 4, member 2 has both of its sides 6 and 5 covered by an L-shaped conduit means defined by upstanding sides 40 and 41 which are joined by bottom side 42. Upstanding side 41 extends up to upper side 4 thereby forming a conduit 50 which encompasses both bottom side 6 and upstanding side 5, and also encompasses photovoltaic cells 7 and 28. Cells 7 and 28 are connected together electrically by wires 43 so that wires 8 can still be used for the removal of electricity from the device for all photovoltaic cells in the device.

Figure 5:
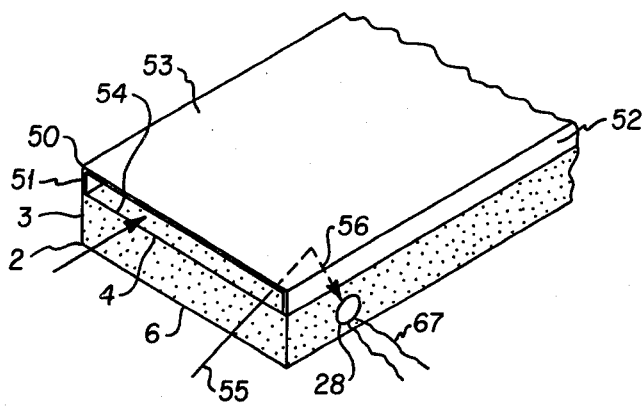

FIG. 5 shows an embodiment wherein the cooling conduit is employed on the upper surface 6 of member 2 since luminescent photovoltaic devices can generate electricity from diffuse or indirect light and do not require direct sunlight. Cooling conduit means 50 is composed of upright walls 51 and 52 which are closed on their upper ends by side 53. In this embodiment conduit 50 has a closed bottom represented by bottom side 54 which can itself be, or can be coated with, a diffusive material which will break up incident light to maximize interior reflection within member 2 and maximize the chances of light staying in member 2 (as opposed to being reflected back out of the cell) until it reaches a photovoltaic cell. For example, if incident light ray 55 were to hit a mirrored surface 54 it would be reflected back toward side 6 at essentially the same angle in which it entered side 6 and thereby stand a very good chance of simply leaving side 6 and being lost. However, if ray 55 hits diffusive member 54 which has a rough or uneven surface or a painted surface or the like, ray 55 will be broken up into a large number of subrays which will then be reflected by side 54 at varying angles as represented by subray 56. Since the subrays are reflected at different angles from the angle in which ray 55 entered through side 6 they will then tend to reflect internally within member 2 until they reach photovoltaic cell, e.g., subray 56 hitting cell 28, thereby generating electricity which can be removed by way of wires 57.

Figure 6:
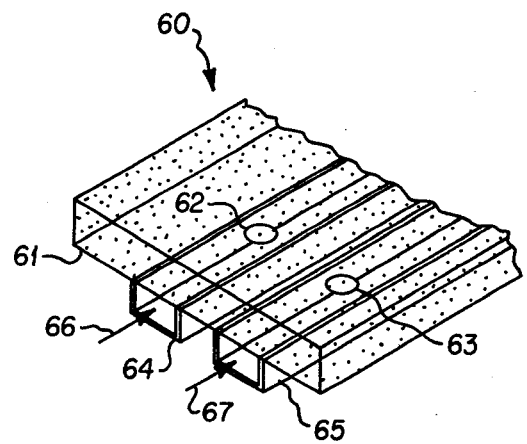

FIG. 6 shows a luminescent member 60 whose bottom side 61 carries two spaced apart photovoltaic cells 62 and 63, each cell being closed by a strip of conduit 64 and 65, respectively, so that not all of bottom side 61 of luminescent member 60 is contacted by a cooling conduit but rather individual cooling conduits are applied to cover a portion of bottom 61 and individual rows of photovoltaic cells. This way individual streams of cooling fluid 66 and 67 can be employed so that different cooling mediums can be utilized if desired, or the individual conduits 64 and 65 can be manifolded together in a conventional manner for use with a single source of cooling medium.

Figure 7:
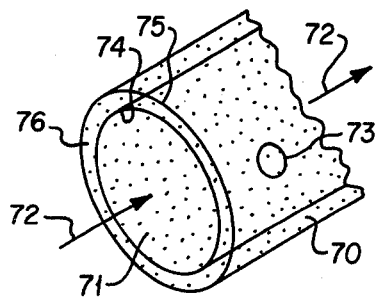
FIGS. 7 and 11 show cylindrical embodiments within the scope of this invention.

FIG. 7 shows a curvilinear cylindrical luminescent member 70 which has a hollow interior conduit 71 that can be used as a cooling conduit for the flow of cooling medium, arrow 72, therethrough. In this embodiment the luminescent member forms the entire cooling conduit rather than part or none of the cooling conduit as shown in previous embodiments. In this FIGURE photovoltaic cells 73 are mounted on the interior surface 74 so that these cells extend directly into conduit 71. As described in reference to FIG. 3 such cells could be employed in addition to or in lieu of cells 73 on outer surface 75 or edges such as edge 76.

Figure 8:
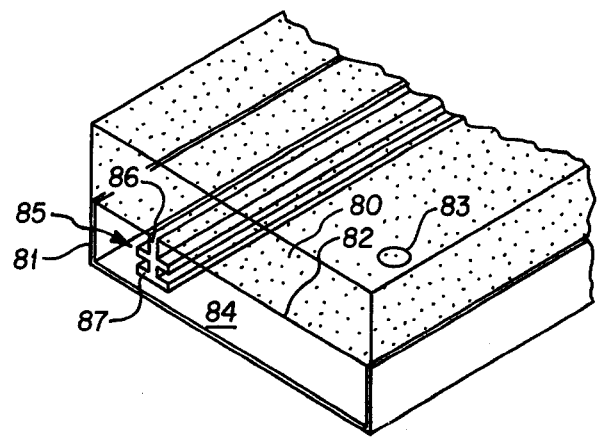
FIG. 8 shows an embodiment within this invention employing heat exchange means extending into the conduit means.

FIG. 8 shows an embodiment wherein planar luminescent member 80 has in contact with its bottom side a rectangular cooling conduit 81, member 80 carrying on its bottom side 82 one or more photovoltaic cells 83 that extend into the interior 84 of conduit 81 for direct cooling. In this embodiment luminescent member 80 carries integral therewith a downward projecting heat exchange device 85 to better carry heat from member 80 into the interior 84 of conduit 81. The heat conducting and radiating means 85 can be of any desired configuration, FIG. 8 showing a stem 86 connected to member 80 for conduction of heat from member 80 into space 84. Stem 86 is terminated by a plurality of radiating fins 87 for exposing a large surface area to the cooling medium. Radiating means 85 can extend for the full length of member 80 as shown or can be a plurality of individual projections disposed over side 82.

Figure 9:
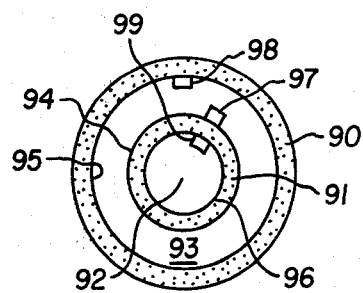
FIGS. 9 and 10 show yet other curvilinear embodiments within the scope of this invention.

FIG. 9 shows an adaptation of the curvilinear cylindrical luminescent member of FIG. 7 wherein a plurality of concentric, spaced apart, round cylindrical luminescent members 90 and 91 are employed. Innermost member 91 defines a circular conduit 92 for the flow of cooling fluid therethrough while the annulus 93 between outer surface 94 of member 91 and inner surface 95 of member 90 defines yet another conduit means for the flow of cooling fluid therethrough. Additional outer concentric members beyond member 90 can be employed as desired.

Photovoltaic cells can be employed on numerous surfaces in this embodiment, such as cell 99 on innermost surface 96, cell 97 on surface 94, cell 98 on surface 95, and so on. Note that cells 97 and 98 both extend into the interior of conduit 93 for direct cooling of cells from two luminescent members by a single conduit.

Figure 10:
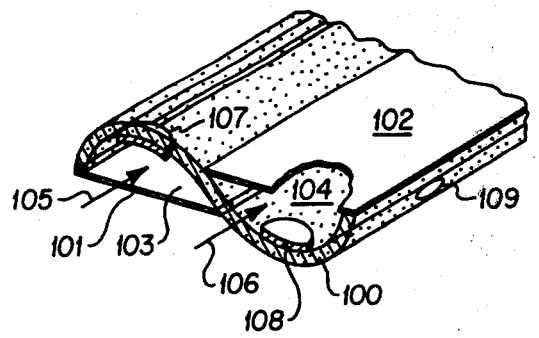

FIG. 10 shows luminescent member 100 to be of sinusoidal configuration with its alternate open sides closed by members 101 and 102 to form a plurality of cooling conduits 103 and 104. A plurality of cooling medium streams 105 and 106 can be employed as described hereinabove with respect to FIG. 6. Photovoltaic cells 107 and 108 can be employed on member 100 in conduits 103 and 104 and/or outside of those conduits such as shown by cell 109.

Figure 11:
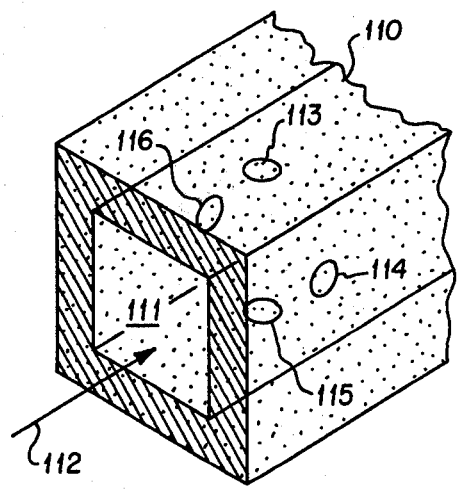

FIG. 11 shows a planar cylindrical luminescent member 110 which by its planar sides defines a rectangular cooling conduit 111 for flow of cooling medium 112 thereinto, the interior sides of member 110 carrying photovoltaic cells 113 through 116.

The luminescent members are composed of a matrix material which contains dispersed throughout one or more luminescing agents as represented by the dots in various FIGURES even though in actuality the luminescing agent or agents are not visible as discrete dots. Luminescent photovoltaic devices are known in the art such as the device fully and completely disclosed in Applied Optics, Volume 15, No. 10, pages 2299 and 2300, October, 1976, the disclosure of which is incorporated herein by reference. The luminescent art is quite old, the observation that some materials emit visible radiation when exposed to the sunlight being traceable back over four hundred years. One of the first, if not the first, scintillation material (2,5-diphenyloxazole) was synthesized in 1896. Scintillation devices and lasers are in the luminescence area and have received extensive study in recent times.

Thus, to one skilled in the art, luminescent agents are well known and can be readily chosen once the operational parameters are set. For this invention it is required that one or more luminescent agents be employed which, upon absorbing light emit multidirectional light in a narrower energy level band. This definition of luminescent agent includes the cascading approach where one luminescent agent absorbs light, emits radiation in a narrower energy level which another luminescent agent absorbs and then emits in yet a narrower energy band which is then absorbed by the photovoltaic cell or is yet further absorbed by another luminescent agent and re-emitted and so on. Thus, the amount and types of luminescent agents employed or mixtures thereof will vary widely depending upon the particular photovoltaic cell employed, the particular use to which the device of this invention is to be put, and the like so that it is impossible to quantify all possible amounts other than functionally as set forth above. However, once the obvious functional questions are answered, one skilled in the art can pick the appropriate luminescent agent or agents and matrix material.

The luminescent member matrix material can be a polymeric material which is transparent to at least the visible light spectrum and therefore can be a polymeric material such as polymethylmethacrylate, other known acrylic polymers, and the like or glass.

The luminescent agents can include metals or oxides or other compounds of the metals such as the neodymium oxide containing glass used by the prior art for luminescent medium or one or more laser dyes which are well known in the art and commercially available such as the coumarin family of dyes and the rhodamine family of dyes. These dyes are very complex chemically, e.g., coumarin 102 is 2,3,5,6-1H,4H-tetrahydro-8-methylquinolazino-[9,9A,1-GH] coumarin and rhodamine 110 is O-(6-amino-3-imino-3H-xanthen-9-yl) benzoic base acid hydrochloride, but these materials and the characteristics thereof are well known in the art and commercially available so that further detailed description is unnecessary to one skilled in the art.

The luminescent agent or agents are simply dispersed in the matrix material by mixing while the matrix material is in a fluid state due to heating. After the mixing process the luminescent material is cast or otherwise shaped into the desired configuration for the luminescent member and after such shaping is ready for the attachment of the photovoltaic cell or cells.

Photovoltaic cells are also well known in the art and vary widely as to their characteristics but generally cells based on germanium, silicon, indium phosphide, gallium arsenide, cadmium telluride, aluminum antimonide, cupric oxide, selenium, gallium phosphide, cadmium sulfide, combinations thereof, and the like can be employed in this invention so long as the particular luminescent agents employed match either directly or by way of cascading the particular energy band at which the one or more photovoltaic cells most efficiently convert light energy to electricity. The preparation and characteristics of photovoltaic cells are well known in the semiconductor art and therefore further detailed descriptions are unnecessary to one skilled in the art.

The photovoltaic cells can be attached to the luminescent member in any conventional manner such as gluing with a transparent glue such as silicone or polyvinylbutyrate or physically holding in place with a moisture barrier or the like, the moisture barrier being physically attached to luminescent member by gluing and the like. The photovoltaic cells employed in this invention can be of any size, shape or configuration desired.

Reasonable variations and modifications are possible within the scope of this disclosure without departing from the spirit and scope of this invention.

The embodiments of the invention in which an exclusive property or privilege is claimed are defined as follows:

1. A luminescent photovoltaic device comprising a curvilinear luminescent member having a plurality of sides, photovoltaic means on at least one of said sides, conduit means in heat exchange relationship with at least one of said sides, said conduit means being adapted to have a cooling fluid passed therethrough to cool said luminescent member.

2. A device according to claim 1 wherein said conduit means covers at least part of said sides which carry said photovoltaic means thereby to cool both said luminescent member and said covered photovoltaic means.

3. A device according to claim 1 wherein said photovoltaic means is carried on one side of said luminescent member and said conduit means covers said photovoltaic means side.

4. A device according to claim 1 wherein said conduit means covers essentially only said photovoltaic means.

5. A device according to claim 1 wherein said luminescent member is cylindrical and the center of said cylinder forms said conduit means.

6. A device according to claim 1 wherein said luminescent member is semicylindrical and closed on its open side to form said conduit means.

7. A device according to claim 1 wherein a heat radiating means is integrally attached to said luminescent member and extends into said conduit means.

8. A device according to claim 1 wherein a plurality of concentric spaced apart round cylindrical luminescent members are employed, and said conduit means includes the center of the innermost cylinder and the annulus between adjacent cylinders.

9. A device according to claim 1 wherein said luminescent member is sinusoidal and closed on its open sides to provide a plurality of individual conduit means.

* * * * *